United States Patent
Ulbrich

(10) Patent No.: US 8,350,215 B2
(45) Date of Patent: Jan. 8, 2013

(54) THERMOPILE SENSOR AND METHOD OF MANUFACTURING SAME

(75) Inventor: Nicolaus Ulbrich, Gomaringen (DE)

(73) Assignee: Robert Bosch GmbH, Stuttgart (DE)

( * ) Notice: Subject to any disclaimer, the term of this patent is extended or adjusted under 35 U.S.C. 154(b) by 671 days.

(21) Appl. No.: 12/538,422

(22) Filed: Aug. 10, 2009

(65) Prior Publication Data

US 2010/0032788 A1 Feb. 11, 2010

(30) Foreign Application Priority Data

Aug. 8, 2008 (DE) .......................... 10 2008 041 131

(51) Int. Cl.
*G01J 5/00* (2006.01)
*G01J 5/20* (2006.01)
(52) U.S. Cl. .................................. 250/338.3; 250/338.4
(58) Field of Classification Search .................. 250/368, 250/338.3, 338.4; 257/464, 431, 465, 466, 257/428

See application file for complete search history.

(56) References Cited

U.S. PATENT DOCUMENTS

| | | | | |
|---|---|---|---|---|
| 6,987,223 | B2* | 1/2006 | Schneider | 136/225 |
| 2003/0205670 | A1* | 11/2003 | Shibayama | 250/338.4 |
| 2005/0034749 | A1* | 2/2005 | Chen et al. | 136/224 |
| 2008/0128620 | A1* | 6/2008 | Krellner et al. | 250/338.1 |

* cited by examiner

*Primary Examiner* — David Porta
*Assistant Examiner* — Carolyn Igyarto
(74) *Attorney, Agent, or Firm* — Kenyon & Kenyon LLP

(57) ABSTRACT

A thermopile sensor for detection of infrared radiation in a measurement wavelength range having a sensor substrate in which a cavity is formed, a diaphragm formed on the sensor substrate above the cavity, at least one thermopile structure formed in, on, or below the diaphragm, having at least one thermopile pair of mutually contacted thermopile legs, where the two thermopile legs are made of doped semiconductor materials having different Seebeck coefficients, and at least one insulating intermediate layer formed between the thermopile legs. A layer system having at least the two thermopile legs and at least the insulating intermediate layer is formed above the lower cavity and has multibeam interference for IR radiation in the measurement wavelength range, absorbing a portion of the IR radiation and at least partially reducing the reflection.

20 Claims, 3 Drawing Sheets

THERMOPILE SENSOR AND METHOD OF MANUFACTURING SAME

CROSS REFERENCE

The present application claims the benefit under 35 U.S.C. §119 of German Patent Application No. 102008041131.0 filed on Aug. 8, 2008, the entirety of which is expressly incorporated herein by reference.

BACKGROUND INFORMATION

Thermopile sensors are used as infrared sensors and allow micromechanical manufacturing on a semiconductor substrate. They are used as spectroscopic gas sensors, in particular, e.g., in the automotive field, and also in infrared cameras having image resolution.

Thermopile sensors are usually designed as a series connection of thermopile pairs on a diaphragm, each thermopile pair having two thermopile legs contacted in a hot contact on the diaphragm or thermopile legs made of materials having different Seebeck coefficients. Conventional pairings of materials for the thermopile legs include silicon and aluminum or p-silicon and n-silicon (p-doped and n-doped silicon) as well as material systems based on bismuth tellurides, for example.

The contact point of the thermopile pair heats up as a function of the incident IR radiation. An absorption layer, i.e., absorber layer, is therefore usually applied to the top side of the diaphragm, which has good absorption properties in the relevant wavelength range. For example, ruthenium-containing resistance pastes, gold-black coating, silver-black coating or other absorber materials are used here for absorption.

However, such absorber materials may not be used in a CMOS production line in general.

The properties of a radiation sensor are described in general by the ratio of detector voltage Vth and incident power $\phi$. Voltage sensitivity S of the detector is thus obtained as $$S = \left|\frac{V_{th}}{\Delta T}\right|\left|\frac{\Delta T}{\Phi}\right| = \frac{a \cdot t}{G} \frac{N \cdot (\alpha_{S,a} - \alpha_{S,b})}{\sqrt{1 + \omega^2 \tau_{th}^2}}$$

where a is the absorbtivity of the thermopile, t is the transmittivity of the radiation path, N is the number of thermocouples and $\Delta T$ is the temperature difference between cold and hot contacts of the thermopile. $(\alpha_{S,a} - \alpha_{S,b})$ is the combined Seebeck coefficient of the material pair a b. Furthermore, $\tau_{th}$ is the thermal time constant describing the response of the detector to a radiation intensity $\phi$ modulated with frequency $\omega$, and G is the thermal conductivity.

Absorbtivity a $(\lambda)$ thus determines the sensitivity of the radiation detector, is usually a function of wavelength $\lambda$ and may reach up to 99%, depending on the material used, e.g., ruthenium-containing resistance pastes. One disadvantage of ruthenium-containing resistance pastes in particular is in the manufacturing process, where the paste is first applied to the particular sensor diaphragm by dispensing individual paste drops and the paste is solidified in a heating step in which the organic components of the paste are expelled. This manufacturing process is very complex and expensive and furthermore is not compatible with the usual systems for CMOS fabrication. One disadvantage of gold-black or silver-black coatings, for example, is also that these materials are not compatible with the manufacturing operations in a CMOS line.

SUMMARY

With an example thermopile sensor according to the present invention, the infrared radiation is absorbed by multibeam interference in a layer system formed on or including the diaphragm. The layer system includes the two thermopile legs and the insulating intermediate layer formed between them plus preferably other layers, in particular an upper insulation layer and the diaphragm itself.

Because of its layer sequence, i.e., the refractive indices and layer thicknesses, the layer system produces a reduction in reflection through multibeam interference, i.e., the beams or partial beams striking the layer sequence at least partially produce a destructive interference in the direction of reflection. Such multibeam interference and reduced reflection are fundamentally also in antireflective coatings and finishes in the optical field.

Layer thicknesses are thus preferably formed in the range of or below the relevant wavelength. Absorption is achieved in particular through targeted doping of the semiconductors layers involved, i.e., in particular the thermopile layers per se, and additional auxiliary layers also applied for this purpose, if necessary.

The entire layer system including the diaphragm is thus advantageously transparent for IR radiation, so the IR radiation passes through this layer system, and the individual layers contribute to the destructive interference of the reflection components.

According to an example embodiment of the present invention, the radiation detector, i.e., thermopile sensor, may thus be designed to be free of special absorber layers, e.g., ruthenium-containing pastes or gold-black or silver-black coatings. The layer system may be formed using standard CMOS processes in particular.

The manufacturing method according to the present invention thus allows a pure CMOS technology in standard systems of a CMOS line and there is no risk of contamination of the CMOS system with materials such as ruthenium, gold and silver. Micromechanical manufacturing of the sensor substrate having a diaphragm and cavity may be performed using conventional techniques.

A thin metal layer, e.g., an Al layer, contacting the thermopile legs formed one above the other may, if necessary, be applied only in the area of contacting of the two thermopile legs. However, application of such a metal layer is the standard in CMOS techniques, in which the reduced reflection and high absorption property of the layer system are not significantly impaired due to the slight lateral extent of the metal contacts. Such metal contacts, which may also protrude slightly onto the top side or bottom side, are therefore not regarded as a metallic absorber layer according to the example embodiment of the present invention.

The example layer system according to the present invention may in particular be designed in such a way that the two thermopile legs have the same optical thicknesses, i.e., in particular the same layer thicknesses with doping of the same strength but opposite polarity of the Si material and also the same optical thicknesses between their first insulating intermediate layer and an upper insulation layer on the upper thermopile leg, i.e., in particular the same layer thicknesses with essentially the same insulation material transparent for IR radiation. This yields a structure of two interleaved pairs of the same layer thickness, thus achieving a good reflection suppression and defining the absorption through suitable doping, preferably together with the lower diaphragm, which is transparent for IR radiation.

DETAILED DESCRIPTION OF EXAMPLE EMBODIMENTS

Figure 1:
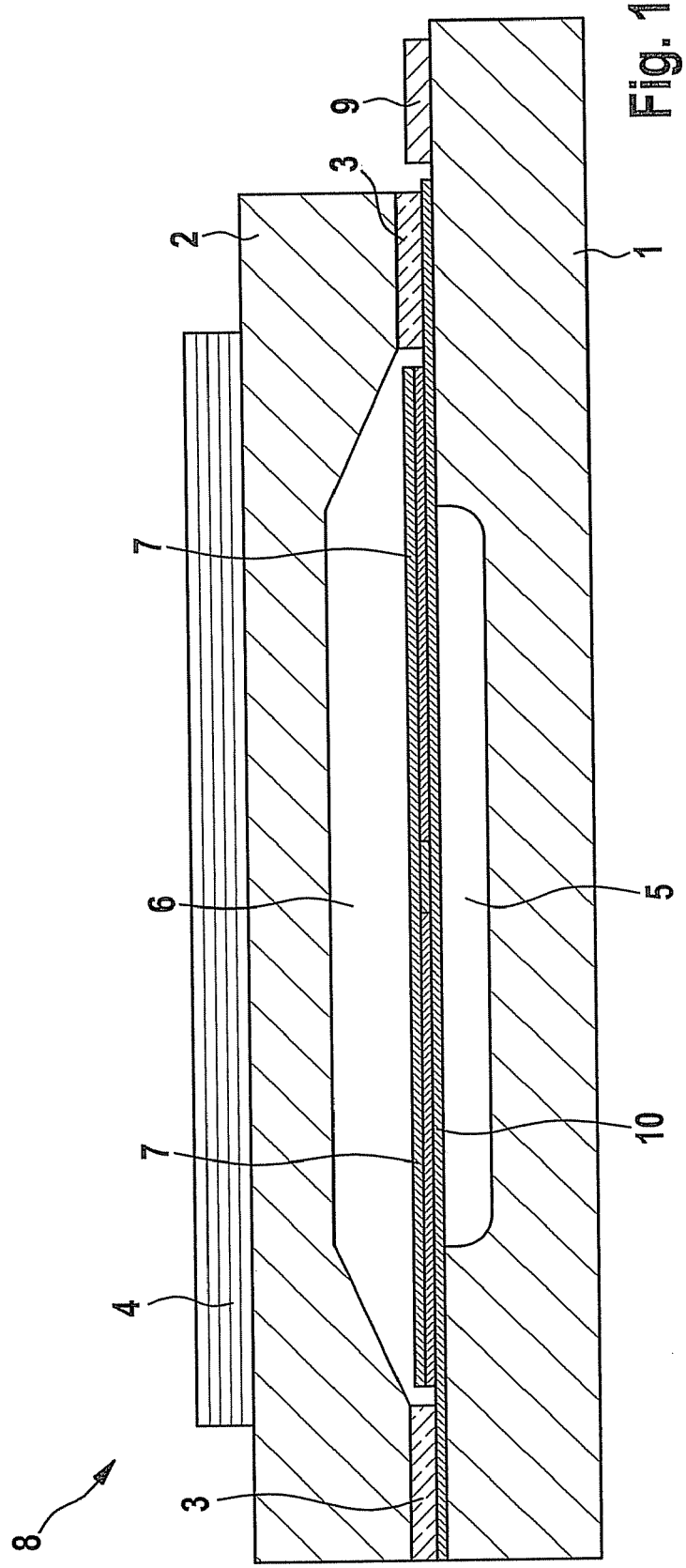
FIG. 1 shows an example thermopile sensor according to the present invention in a vertical section.

A thermopile sensor 8 shown in FIG. 1 has a sensor substrate 1 and a cap substrate 2 of silicon joined to a seal glass layer 3 by seal glass bonding to be hermetically sealed, i.e., vacuum-tight. A filter 4 is advantageously provided on the top side of cap substrate 2, allowing incident IR radiation IR to pass through in a wavelength-selective manner to allow detection of a measurement wavelength range $\lambda$m. For example, absorption lines of $CO_2$ or another gas may occur in measurement wavelength range $\lambda$m. However, as an alternative to the specific embodiment shown here, filter 4 may also be provided in a window in a housing in which thermopile sensor 8 is held.

A lower cavity 5 is formed on the top side of sensor substrate 1, an self-supporting diaphragm 10 being formed above it, designed as a layer or as a layer system of multiple layers, in particular insulating layers, e.g., $SiO_2$, where diaphragm 10 extends laterally beyond cavity 5 up to the bulk material of sensor substrate 1. At least one thermopile pair 7 having a first thermopile leg 11 and a second thermopile leg 13 is provided on diaphragm 10. Multiple thermopile pairs 7 are advantageously provided in a cascade or connected in series to obtain a higher measurement signal. Thermopile pairs 7 here are advantageously situated side by side laterally, so that additional thermopile pairs 7 are formed above and below the plane of the drawing.

Figure 2:
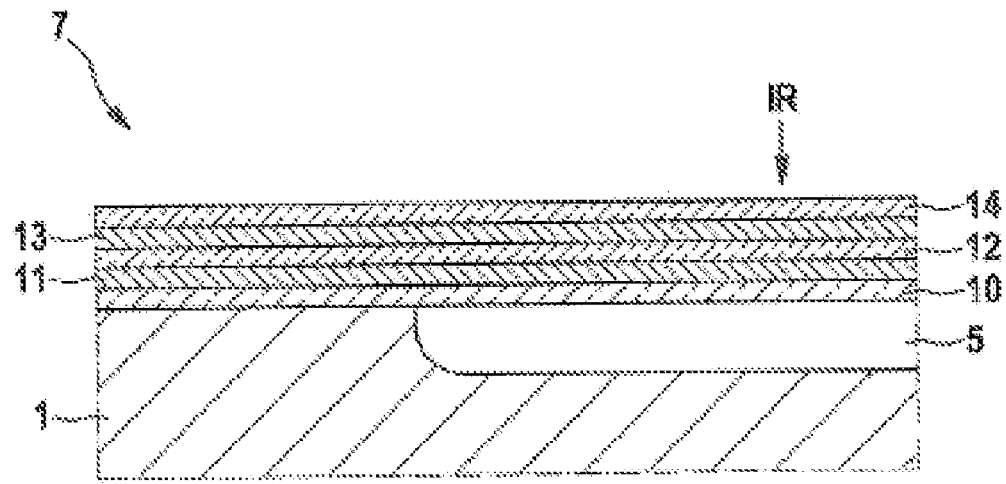
FIG. 2 shows an enlarged detail from FIG. 1 according to a first specific embodiment having four layers on the diaphragm.

The layer structure in the specific embodiment according to FIG. 2 thus has five layers, namely diaphragm 10, first thermopile leg 11 of doped semiconductor, e.g., n-doped silicon, a first intermediate layer 12 of $SiO_2$, for example, which provides insulation, a second thermopile leg 13 of a doped semiconductor material, e.g., p-doped silicon, and an upper insulation layer 14 providing cover and insulation.

The materials of both thermopile legs 11, 13 have different Seebeck coefficients in a known manner. Differently doped semiconductor material, e.g., n-doped and p-doped silicon, may be selected here advantageously.

According to the present invention, a layer system 19 of layers 10, 11, 12, 13, 14 is formed according to the present invention, forming a multibeam interference for IR radiation IR that is incident from above and is in the measurement wavelength range, e.g., for $\lambda$ between 4.0 and 4.5 µm or a partial range thereof, resulting in a high absorbtivity a. According to the present invention, it is recognized here that generally a layer system 19 having layer thicknesses corresponding to an antireflective coating may be selected for this purpose, but there may be a higher absorption in some layers. Thermopile legs 11, 13 are advantageously designed to have a higher absorption, so that a higher doping may be selected, which additionally also reduces problems in metal contacting, i.e., contributes toward preventing Schottky contacts and yields a high measurement signal.

Layer thicknesses d10, d11, d12, d13, d14 of layers 10 through 14 are selected in such a way that the desired multibeam interference is achieved. The goal here in particular is to largely prevent reflection over measurement wavelength range $\lambda$m. Transmission is largely eliminated in particular by the higher absorption but is fundamentally not a problem.

In an advantageous design of the layer system, reflected and transmitted radiation intensities $I_{Ref}$ and $I_T$ are as low as possible and absorbtivity $a(\lambda)=1-I_{Ref}-I_T$ is as high as possible. The exact characteristic of the complex refractive index having a real component and an imaginary component is used to calculate absorbtivity $a(\lambda)$, the complex refractive index being a function of the dopant concentration for doped semiconductor layers or metals, which may be calculated by the Drude model of free charge carriers, for example.

FIG. 2 shows, for example, a 900-nm-thick n-doped polysilicon layer 11, e.g., having phosphorus doping and a charge carrier concentration of $1e20\ cm^{-3}$, a 300-nm-thick first intermediate layer 12 of $SiO_2$, a 900-nm-thick p-doped polysilicon layer 13, e.g., of boron-doped polysilicon having a charge carrier concentration of $1e20\ cm^{-3}$ and a 300-nm-thick upper insulation layer 14.

It is recognized according to the present invention that lower diaphragm layer 10 may not be relevant here, since sufficient multibeam interference with absorption should be achieved already in upper four layers 11, 12, 13, 14.

Figure 3:
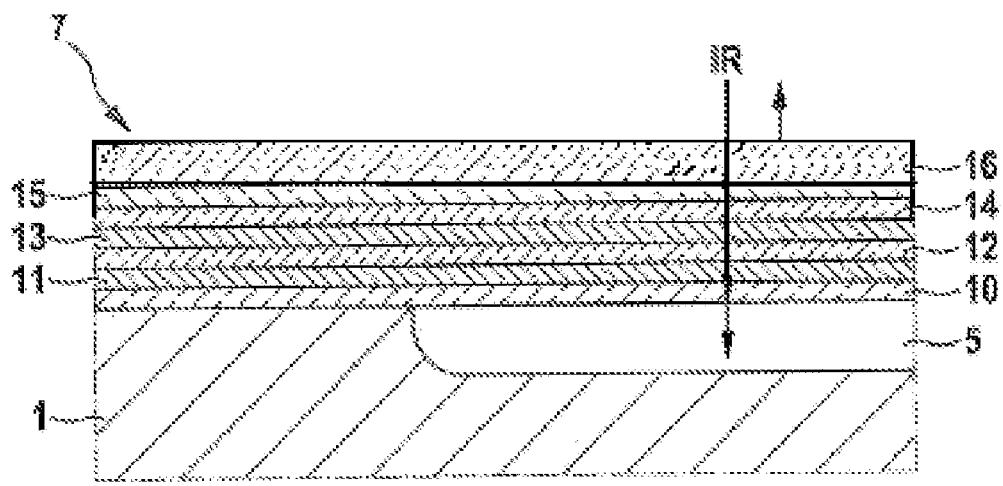
FIG. 3 shows a similar enlarged detail of a second specific embodiment having six layers on the diaphragm.

FIG. 3 shows another specific embodiment in which corresponding layers are provided as in FIG. 2, but upper insulation layer 14 functions as a second intermediate layer to which a first auxiliary layer 15 and a second auxiliary layer 16 are applied. Auxiliary layers 15, 16 here are also formed from a material that is transparent for IR radiation in measurement wavelength range $\lambda$m and allow multibeam interference over a larger number of layers. FIG. 3 thus shows a layer system 20 having six layers situated above diaphragm 10. Layers d10, d11, d12, d13, d14 here may correspond to those of the specific embodiment from FIG. 2.

According to another specific embodiment, the layer thickness composition in FIG. 2 and/or FIG. 3 may also be designed as follows, for example:

A diaphragm 10 of 600-nm-thick $SiO_2$, a first thermopile leg 11 of phosphorus-doped polysilicon having a layer thickness d11=700 nm and a charge carrier concentration of $1e20\ cm^{-3}$, a first intermediate layer 12 of $SiO_2$ having d12=700 nm, a second thermopile leg 13 of boron-doped polysilicon having a layer thickness d13=700 nm and a charge carrier concentration of $1e20\ cm^{-3}$, and a second intermediate layer 14 of $SiO_2$ having a layer thickness d14=700 nm.

Absorption may occur here in only a few layers, e.g., in layers 11, 13, 15 of layer system 19 or 20, because due to the insulation over lower cavity 5 and upper cavity 6, diaphragm 10 is self-supporting and insulated and there is sufficient thermal conduction in the vertical direction to equalize the temperature, so that thermopile pair 7 is exposed to generally the same temperature.

In both specific embodiments, first auxiliary layer 15, e.g., of phosphorus-doped polysilicon of a layer thickness d15=450 nm and a charge carrier concentration of $2e20\ cm^{-3}$ and second auxiliary layer 16 of $SiO_2$ and/or $S_3N_4$ of layer thickness d16=700 nm may be formed as shown in FIG. 3. As an alternative to this, layer thickness d15=450 nm and a charge carrier concentration of $1e20\ cm^{-3}$ and layer thickness d16=700 nm, for example, may be selected.

Figure 4:
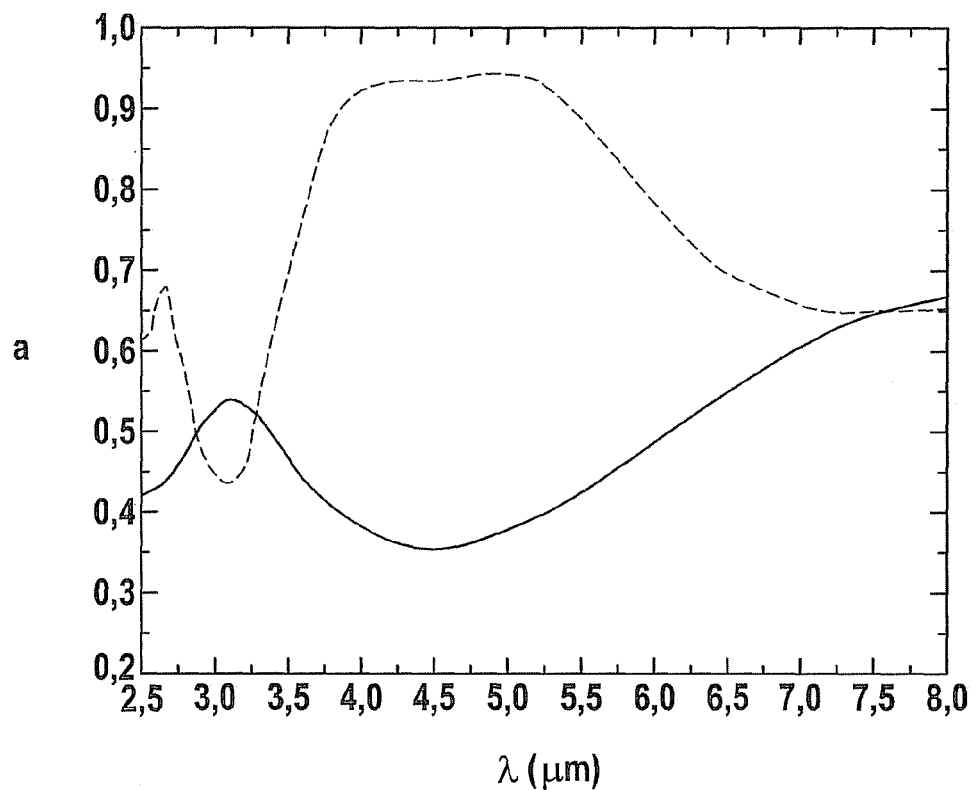
FIG. 4 shows a diagram of absorbtivity a as a function of wavelength $\lambda$.

For this specific embodiment, the calculated absorption spectrum is shown as a dashed line in FIG. 4. The relevant wavelength range for a $CO_2$ gas sensor system is between approximately 4.0 and 4.5 µm. This yields an absorbtivity of more than 90% according to the dashed line. In comparison with that, a traditional layer thickness composition having d11=450 nm, d12=300 nm, d13=450 nm and d14=300 nm, for example, which is traditionally provided with an additional absorption layer on the top of layer 14 to permit adequate absorption, is shown as a solid line.

According to an embodiment of the present invention, additional auxiliary layers may be formed on layers 15, 16 to allow multibeam interference and high absorption.

Figure 5:
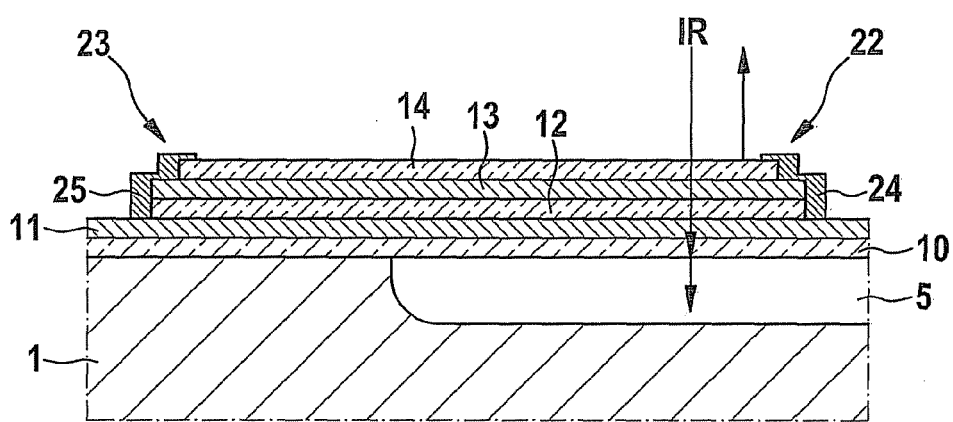
FIG. 5 shows an enlarged detail of a vertical section through the sensor from FIG. 2 or 3 in the area of the metal contact of the thermopile legs.

Thermopile legs 11, 13 may contacted in particular according to FIG. 5, showing a vertical section in an offset lateral position, in particular above or below the plane of the drawing of FIGS. 2, 3. Metal contacts 22, 23 contact thermopile legs 11, 13 and extend upward to the top side of upper insulation layer 14. Cascading of multiple thermopile pairs 7 is also accomplished via metal contacts 23, 24. Metal contacts 22, 23 may be provided in offset planes here. A right-hand thermal contact 22 forms the "hot" contact on diaphragm 10, while a left-hand thermal contact 23 represents the "cold" contact above the bulk material of sensor substrate 1. Contacting of thermopile legs 11, 13 is thus accomplished by metal contacts 24 and 25, according to this specific exemplary embodiment, where these metal contacts are designed as structured areas of a metallization layer. In the embodiment shown here, left-hand contact 23 thus does not interfere with the multibeam interference in diaphragm 10. Hot contact 22 on the right influences the multibeam interference only in a very narrow lateral range and is therefore not relevant.

What is claimed is:

1. A thermopile sensor for detection of infrared radiation in a measurement wavelength range, comprising:
    a sensor substrate in which a cavity is formed;
    a diaphragm formed on the sensor substrate above the cavity; and
    at least one thermopile structure which is formed in, on or below the diaphragm and has at least one thermopile pair of two mutually contacted thermopile legs, the two thermopile legs being formed from doped semiconductor materials having different Seebeck coefficients,
    at least one insulating intermediate layer between the thermopile legs,
    a layer system formed above the cavity,
    said layer system includes said at least two thermopile legs, said at least one insulating intermediate layer, and an upper insulation layer formed above said at least two thermopile legs,
    said layer system forms a multibeam interference for IR radiation in the measurement wavelength range with absorption of part of the IR radiation and at least partial reduction in reflection,
    wherein the layer system also includes at least two additional auxiliary layers, which are formed above the upper insulation layer,
    wherein the at least two additional auxiliary layers have different layer thicknesses.

2. The thermopile sensor as recited in claim 1, wherein the layer system also includes the diaphragm, the diaphragm being formed from an IR-transparent insulation material.

3. The thermopile sensor as recited in claim 2, wherein the IR-transparent insulation material is SiO2.

4. The thermopile sensor as recited claim 1, wherein said upper insulation layer comprises an insulation material, which is transparent for IR radiation.

5. The thermopile sensor as recited claim 4, wherein the insulated material is SiO2.

6. The thermopile sensor as recited in claim 4, wherein each of said two thermopile legs have the same layer thickness, and the insulating intermediate layer formed between the thermopile legs and the upper insulation layer are formed from a transparent insulation material having the same layer thickness.

7. The thermopile sensor as recited in claim 6, wherein the thermopile legs have the same layer thicknesses of 700 nm or 900 nm.

8. The thermopile sensor as recited in claim 1, wherein the thermopile legs have opposite dopings and approximately the same charge carrier concentrations.

9. The thermopile sensor as recited in claim 8, wherein the charge carrier concentrations are above 1e18 cm-3.

10. The thermopile sensor as recited in claim 9, wherein the charge carrier concentrations are approximately 1e20 cm-3.

11. The thermopile sensor as recited in claim 1, wherein at least one of the additional auxiliary layers is a doped semiconductor layer to increase absorption and is covered by at least one additional insulation layer.

12. The thermopile sensor as recited in claim 1, wherein all layers of the layer system are formed from insulation layers that are nonreflective for IR radiation and semiconductor layers.

13. The thermopile sensor as recited in claim 1,
    wherein said cavity makes-up a lower cavity,
    a cap substrate is attached with a vacuum-tight seal to the sensor substrate,
    an upper cavity being formed on an underside of the cap substrate, and
    the layer system including all the layers between the lower cavity and the upper cavity.

14. The thermopile sensor as recited in claim 1, wherein the layer system and an upper side and lower side of the layer system are free of absorber materials containing metal.

15. The thermopile sensor as recited in claim 1, wherein metal contacts for contacting are formed.

16. The thermopile sensor as recited in claim 1, wherein an absorbtivity of more than 70% of the incident IR radiation prevails in the layer system in the measurement wavelength range.

17. The thermopile sensor as recited in claim 16, wherein the absorbtivity is more than 80%.

18. The thermopile sensor as recited in claim 16, wherein the measurement wavelength range is between 4.0 μm and 4.5 μm.

19. The thermopile sensor as recited in claim 1, wherein incident IR radiation is absorbed at least primarily in the two thermopile legs.

20. A method for manufacturing a thermopile sensor, comprising:
    forming a diaphragm and a plurality of additional layers on a sensor substrate;
    forming a lower cavity in the sensor substrate below the diaphragm and the additional layers to form a self-supporting structure including the diaphragm and the additional layers,
    said additional layers include at least one first thermopile leg of doped semiconductor material, at least one second thermopile leg of doped semiconductor material, at least one first insulating intermediate layer separating the at least one first thermopile leg and the at least one second thermopile leg, and an upper insulation layer; and
    attaching a cap substrate above the self-supporting layer structure and the lower cavity by vacuum-tight connections on the sensor substrate;
    wherein said additional layers also includes at least two additional auxiliary layers, which is formed above the upper insulation layer,
    wherein the at least two additional auxiliary layers have different layer thicknesses.

* * * * *